United States Patent [19]

Kimyacioglu

[11] Patent Number: 4,866,397
[45] Date of Patent: Sep. 12, 1989

[54] WIDEBAND 0-90 DEGREES ADJUSTABLE PHASE SHIFTER

[75] Inventor: Mehmet K. Kimyacioglu, Mountain View, Calif.

[73] Assignee: Exar Corporation, San Jose, Calif.

[21] Appl. No.: 178,706

[22] Filed: Apr. 7, 1988

[51] Int. Cl.$^4$ .............................................. H03F 3/45
[52] U.S. Cl. .................... 330/252; 330/107; 307/262
[58] Field of Search ........ 330/252, 302, 107; 307/262, 510, 511; 328/55, 155

[56] References Cited

U.S. PATENT DOCUMENTS 3,725,801 4/1973 Beelitz .................................. 330/252

OTHER PUBLICATIONS

Ericsson Review, No. 4 (1986), pp. 135-139, "A New Generation of 2Mbit/s Repeaters", D. Danielsen, T. Ilstrom & C. Landberg.
RIFA AB 1986, pp. 1-6, "Regenerative PCM-Repeater".
EDN, Mar. 21, 1985, pp. 185-200, M. K. Kimyacioglu, "Implement Bell TIC PCM Repeater Using Just Two IC's".

*Primary Examiner*—Steven Mottola
*Attorney, Agent, or Firm*—Townsend and Townsend

[57] ABSTRACT

The present invention is an improved phase shift circuit for a recovered clock signal used to recover data which provides an adjustable 90 degrees phase shift using a linear, constant current charge without requiring an external capacitor for integrated receivers and repeaters. A pair of differential transistors receive an input signal and produce an output with a capacitor coupled between their output electrodes. A pair of switching transistors are coupled between the output electrodes and a voltage source, with the switching transistors being controlled by another differential transistor pair coupled to the input voltage. Each switching transistor provides a fixed voltage level to the capacitor, thus giving a constant current for a linear charge curve. The combination of the two switching transistors limits the voltage swing to $2V_{BE}$. The phase shift is made adjustable by using one current source for the first differential pair and a second current source for the second differential pair. The current source of the first differential pair is adjustable, to provide the phase shift adjustment.

8 Claims, 3 Drawing Sheets

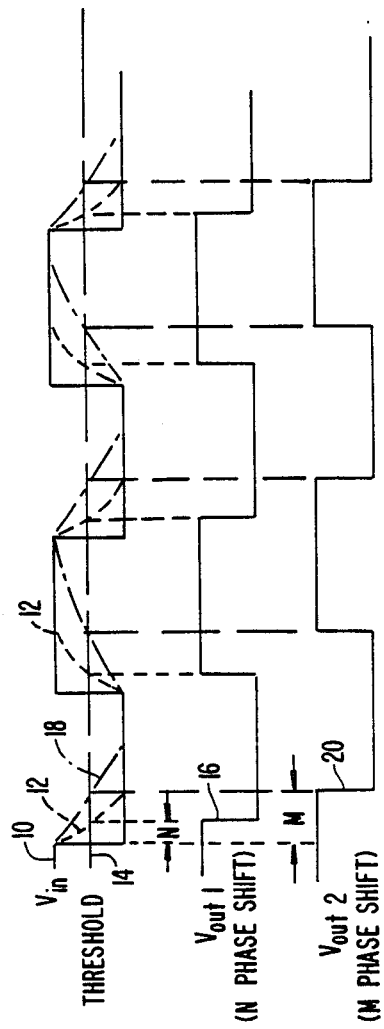
FIG._1. PRIOR ART
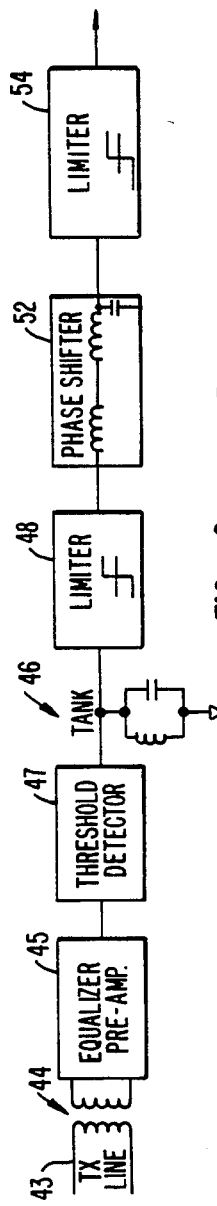
FIG._2. PRIOR ART

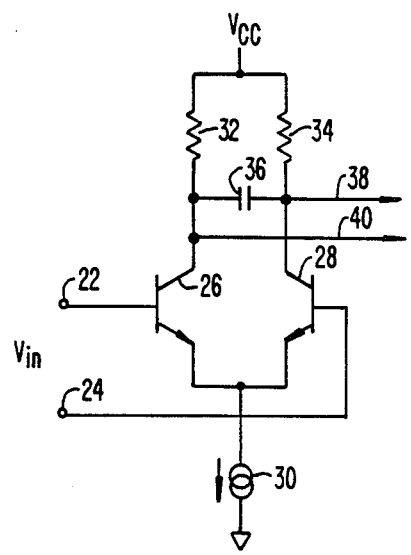
FIG._3. PRIOR ART
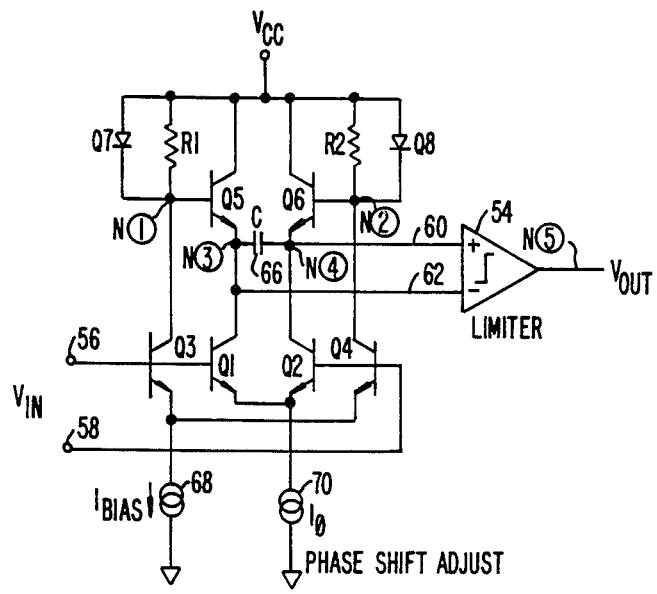
FIG._4.

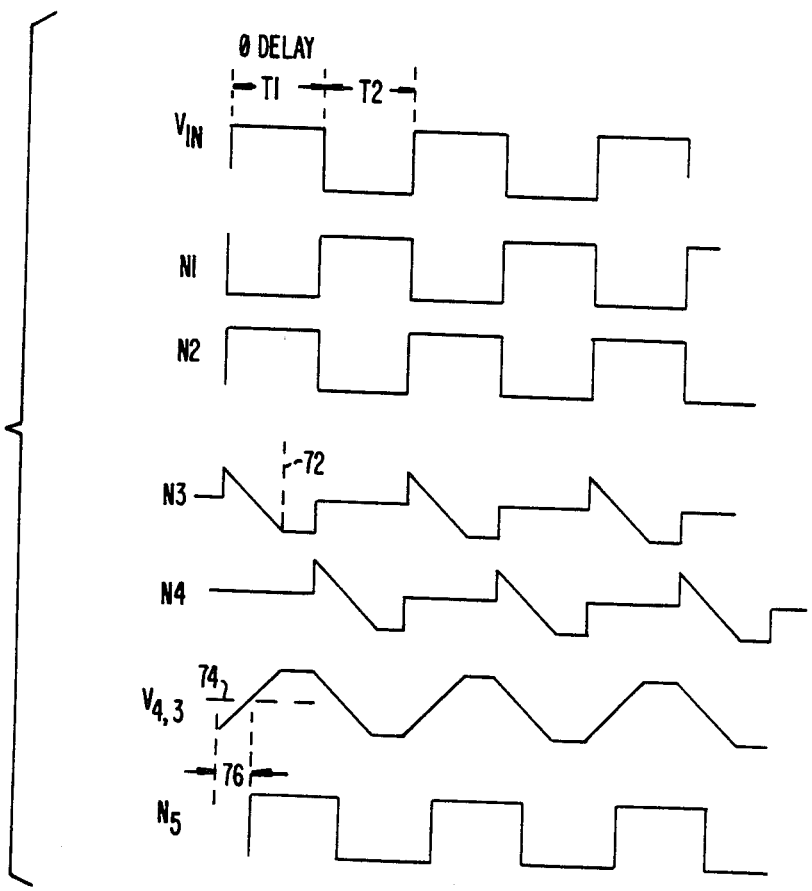
FIG._5.
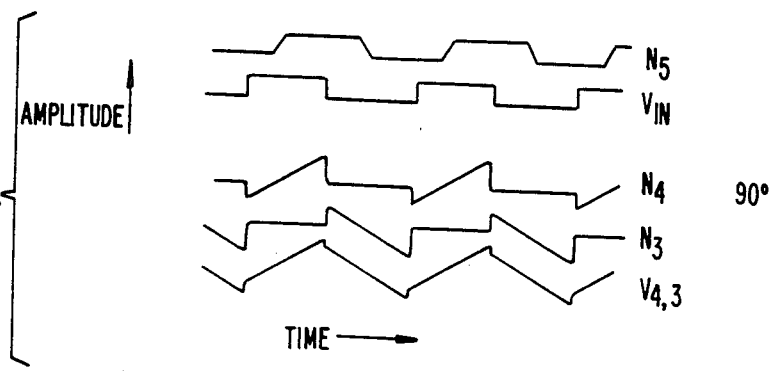
FIG._6.

WIDEBAND 0-90 DEGREES ADJUSTABLE PHASE SHIFTER

BACKGROUND

The present invention relates to phase shift circuits, and in particular to 90 degree adjustable phase shift circuits for sampling an eye pattern of a received signal to recover data from transmission lines.

In data transmission systems, after a clock signal is recovered, it is desirable to shift the clock signal by 90 degrees so that data can be sampled with the clock edge at the middle of the eye pattern. This shifting is needed in order to reduce the bit error rate and is used in both line receivers and repeaters.

A typical method for producing a phase shift is to use a capacitor to delay the rise time of the signal enough to produce the desired phase shift. An example of this is shown in FIG. 1 where a Vin signal 10 is presented to a capacitive circuit. For a first capacitive value, a signal 12 is produced which crosses a threshold value 14 a period of time N after the input signal to produce an output signal (Vout1) 16 which is phase shifted by N. By using the larger capacitance, a signal 18 is produced which crosses threshold 14 at a later time M to produce a phase shifted signal (Vout2) 20 which is shifted by an amount M.

FIG. 2 is a block diagram of a typical clock recovery circuit. A transmission line 43 is coupled into a transformer 44 and then provided to an equalizer and preamplifier 45. The signal is then provided to a threshold detector 47. For AMI bipolar line code transmission, a full wave rectifier is used with a threshold detector to square the received signal. For other types of transmissions, another circuit could be used which raises the received signal to a power of N depending upon the type of transmission coding.

A tank circuit 46, tuned to the clock frequency, is excited by the full wave rectifier output and produces a sine wave signal whose amplitude is data pattern dependent. A limiter 48 converts the sine wave signal into a square wave signal. This square wave is the recovered clock signal. Phase shifter 52 then shifts the clock signal so that the edge of the clock will fall in the middle of the eye pattern. In the example shown, the phase shifter is a simple RLC network. The inductor is optional and is used to emphasize the edges of the waveform. A limiter 54 is used to clip the signal and provide the shifted clock for data recovery.

Because the clock recovery circuitry itself will introduce phase shifts into the signal, some designers adjust tank circuit 46 to tune the circuit to compensate for this internal phase shift in receiver/repeater production. Unfortunately, this will degrade the signal/noise and jitter performance of the circuit.

Another version of phase shifter 52 is shown in FIG. 3. An input signal is applied across terminals 22, 24 to differential transistors 26, 28. These transistors are coupled to a current source 30 and to a positive voltage VCC through resistors 32 and 34. A capacitor 36 is used to provide the output signal shown in FIG. 1 across output terminals 38 and 40. The output signal is an RC exponential signal which is provided to limiter 54 of FIG. 2.

In integrated repeaters and receivers, an external capacitor is typically used for capacitor 36 because of the large value required to obtain a 90 degree phase shift. By using a large time constant (e.g., by using a large capacitance), signal 18 becomes almost linear in the region of interest in FIG. 1, thus giving a 90 degree phase shift. In addition, by making the capacitor external, the system can be adjusted for the frequency of the transmission. For instance, in Europe, PCM systems use 2 megabit/second data rates as opposed to the U.S. rate of 1.544 megabit/second. The external capacitor must be changed to provide the required phase shift at each frequency which may be used.

Other methods not using an external capacitor are believed to use an automatic gain control (AGC) control loop which converts the input signal to a triangular wave and picks a slicing point in the middle of the triangular wave for reproducing a phase shifted square wave. This approach complicates the circuitry and requires more silicon.

SUMMARY OF THE INVENTION

The present invention is an improved phase shift circuit for a recovered clock signal used to recover data which provides an adjustable 90 degrees phase shift using a linear, constant current charge without requiring an external capacitor for integrated receivers and repeaters. A pair of differential transistors receive an input signal and produce an output with a capacitor coupled between their output electrodes. A pair of switching transistors are coupled between the output electrodes and a voltage source, with the switching transistors being controlled by another differential transistor pair coupled to the input voltage. Each switching transistor provides a fixed voltage level to the capacitor, thus giving a constant current for a linear charge curve. The combination of the two switching transistors limits the voltage swing to $2V_{BE}$.

The phase shift is made adjustable by using one current source for the first differential pair and a second current source for the second differential pair. The current source of the first differential pair is adjustable, to provide the phase shift adjustment.

The output of the first differential transistor pair is provided to a limiter to convert the resulting trapezoidal or triangular (for 90° shift) wave signal into a square wave signal.

In the preferred embodiment, resistors are used to couple the voltage supply to the control electrodes of the switching transistors. A diode is coupled in parallel with each of these resistors to limit the voltage level.

For fuller understanding of the nature and advantages of the invention, reference should be made to the ensuing detailed description taken in conjunction with the accompanying drawings.

BRIEF DESCRIPTION OF THE DRAWINGS

FIG. 1 is a diagram of the phase shift waveforms produced by the prior art and the present invention;

FIG. 2 is a block diagram of a typical clock recovery circuit using a phase shifter;

FIG. 3 is a schematic diagram of one prior art phase shifter circuit;

FIG. 4 is a schematic diagram of a phase shifter according to the present invention;

FIG. 5 is a timing diagram showing the waveforms produced by the circuit of FIG. 4 for less than 90° phase shift; and FIG. 6 is a timing diagram for the circuit of FIG. 4 for a 90° phase shift.

DETAILED DESCRIPTION OF THE PREFERRED EMBODIMENTS

FIG. 4 is a schematic diagram of a phase shifter according to the present invention. This phase shifter can be used in place of phase shifter 52 of FIG. 2. The input voltage is applied across terminals 56 and 58. The input is applied to the bases of transistors Q1 and Q2, with the collectors of transistors Q1 and Q2 providing outputs on lines 60 and 62 to limiter 54. A capacitor 66 is coupled between lines 60 and 62. Capacitor 66 is charged and discharged in accordance with the diagram shown in FIG. 5.

Switching transistors Q5 and Q6 alternately provide a path for the current from $V_{CC}$ to capacitor 66. By fixing the voltage level applied to capacitor 66, a constant current is provided through capacitor 66, giving a linear charging curve.

Transistors Q5 and Q6 are alternately turned on by differential transistors Q3 and Q4, which are also coupled to input terminals 56 and 58.

A current source 68 is used for differential pair Q3 and Q4 while a separate current source 70 is used for differential pair Q1 and Q2. By adjusting the value of current source 70, with a constant capacitance 66, the slope of the output curve can be changed to produce the desired phase shift. Thus, by controlling this current source, an adjustment can be made for phase shifts in the receiving circuitry itself in addition to the desired 90 degree phase shift.

The phase shift, $\phi$, produced by the circuit is shown in the following equations.

$$\text{For } \frac{I_\phi(T)}{C} \leq V_{BE}, \phi = 90°;$$

$$\text{For } \frac{I_\phi(T)}{C} > V_{BE}, \phi = \frac{V_{BE}(C)}{2(I_\phi)(T)} (360°)$$

$$\text{For } I_\phi \to \text{very large}, \phi \to 0°$$

Where T=Period, C=capacitance; $\phi$=phase shift angle, $I_\phi$=current through current source 70, $V_{BE}$=Base-emitter voltage of Q5 and Q6.

The operation of the circuit of FIG. 4 can be seen with reference to FIG. 5. A high value of the voltage input during a time period T1 will turn on transistors Q1 and Q3 and turn off their opposing transistors in their respective differential pairs, Q2 and Q4. When transistor Q3 turns on, it conducts and node N1 is brought low as shown in FIG. 5, turning off transistor Q5. The voltage level at node N1 is determined by the parallel combination of resistor R1 and diode Q7. Preferably, R1 has a low value to give a large current through transistor Q3 and thus provide a fast rise time for the signal. Diode Q7 provides a clamping function to limit the voltage level and prevent transistor Q3 from saturating.

Q4 being turned off prevents current from flowing through node N2, keeping it at a high value as shown in FIG. 5. This turns on switching transistor Q6.

With transistor Q6 on, node N4 is kept at a constant voltage equal to the supply voltage less the base-emitter voltage of transistor Q6 ($V_{CC}-V_{BE}$). The small base current through resistor R2 can be ignored. Node N3 is initially pulled up, and then its value is steadily reduced as capacitor 66 is charged in this direction. The current flow is through transistor Q6, capacitor 66, and transistor Q1 to current source 70.

At a point in time 72 as shown on FIG. 5 for waveform N3, the charging of capacitor 66 will lower the voltage at node N3 sufficiently to turn on transistor Q5. The voltage will thus level off at this point since capacitor 66 will not be charged any more because the current flow will be diverted from transistor Q6 to transistor Q5. The voltage at N3 will be the voltage drop across diode Q7 and the base-emitter drop of diode Q5 (assuming a small enough value of R1), or to $V_{BE}$. Thus, capacitor 66 will have charged one $V_{BE}$ in this direction.

The voltage output across nodes N3 and N4 is shown as V4,3 in FIG. 5. When this level passes a threshold value 74, the output of limiter 54 goes high, producing an output signal at node N5 which is phase shifted by an amount 76. When a differential amplifier is used for limiter 54, the threshold value will be 50 percent of the peak-to-peak value.

During a time period T2, the input signal goes low and the process repeats itself in the opposite direction, with capacitor 66 being discharged from its initial polarity by the amount of $1V_{BE}$ and then recharged in the opposite polarity by the amount of $V_{BE}$ as shown by the signal for node N4 in FIG. 5, to give a total voltage swing of $2V_{BE}$. During this period of time, node N3 is held at a constant voltage while node N4 decreases until it reaches $V_{CC}-2V_{BE}$.

FIG. 6 shows the waveforms for a 90° phase shift resulting in a triangular waveform for V4,3 rather than the trapezoidal waveform of FIG. 5. As can also be seen, this is a linear charge curve rather than the exponential curve of the prior art. As can be seen, by increasing the current of current source 70, the linear ramp of the waveform for V4,3 is shifted over without increasing the amplitude of the signal. An adjustment of the current in this manner in the prior art circuit of FIG. 3 would give no additional phase shift since the overall amplitude would also increase.

Since the processing circuitry itself will add additional delay in addition to the 90 degrees phase shift desired, it is desirable to use less than a 90 degree phase shift. This can be accomplished by varying the voltage used to control current source 70. Alternately, a second differential pair of transistors could be use to control the current source with one transistor having the control input coupled to a fixed voltage reference and any other transistor having its control input coupled to a variable resistance. The collector of the first transistor controls the current source transistor while the collector of the second transistor is coupled to the voltage supply.

Thus, the present invention allows compensation for phase shifts introduced by the detection circuitry without requiring an adjustment of the tank circuit as in some of the prior art.

As will be understood by the those familiar with the art, the present invention may be embodied in other specific forms without departing from the spirit or essential characteristics thereof. For example, other means may be used to control the phase shift current adjustment. Alternately, another switching configuration than Q5 or Q6 could be used or an alternate mechanism for limiting the voltage at nodes N3 and N4 could be used, such as using transistors instead of diodes or some other circuit arrangement. Accordingly, the disclosure of the preferred embodiment of the invention is intended to be illustrative, but not limiting, of the scope of the invention which is set forth in the following claims.

What is claimed is:

1. A phase shifter circuit comprising:
   first and second differential transistors having first, control electrodes coupled to receive an input voltage, second electrodes coupled together and third electrodes providing an output voltage;
   first and second switching means coupled between said third electrodes of said first and second transistors, respectively, and a voltage source, said switching means, when activated, providing current at a fixed voltage to one of said first and second transistors;
   third and fourth differential transistors having first, control electrodes coupled to said control electrodes of said first and second transistors and having second electrodes coupled to said first and second switching means, respectively, for activating said switching means;
   a capacitance coupled between said third electrodes of said first and second transistors;
      a first current source coupled to said second electrodes of said first and second differential transistors; and
   means for adjusting a current of said first current source to vary the phase shift of said phase shifter circuit.

2. The phase shifter circuit of claim 1 further comprising a limiter having first and second inputs coupled to said third electrodes of said first and second transistors.

3. The phase shifter circuit of claim 1 further comprising:
   a second current source coupled to third electrodes of said third and fourth differential transistors.

4. The circuit of claim 1 wherein said first and second switching means comprise fifth and sixth transistors having their emitters coupled to said third electrodes of said first and second transistors, respectively, and having bases coupled to said second electrodes of said third and fourth transistors, respectively.

5. The circuit of claim 4 further comprising:
   a first resistor and a first diode in a first parallel combination, said first parallel combination being coupled between said voltage source and said base of said fifth transistor; and
   a second resistor and second diode coupled in a second parallel combination, said second parallel combination being coupled between said voltage source and said base of said sixth transistor.

6. A phase shifter circuit comprising:
   first and second differential transistors having bases coupled to receive an input voltage, emitters coupled together and collectors providing an output voltage;
   third and fourth switching transistors having emitters coupled to said collectors of said first and second transistors, respectively, and collectors coupled to a voltage source;
   fifth and sixth differential transistors having bases coupled to receive said input voltage, emitters coupled together, and collectors coupled to bases of said third and fourth switching transistors, respectively;
   a capacitor coupled between said emitters of said third and fourth switching transistors;
   a first parallel combination of a first resistor and first diode, said first parallel combination being coupled between said voltage source and said bases of said third transistor;
   a second parallel combination of a second resistor and a second diode, said second parallel combination being coupled between said voltage source and said base of said fourth transistor.

7. The circuit of claim 6 further comprising:
   a first current source coupled to said emitters of said first and second transistors;
   a second current source coupled to said emitters of said fifth and sixth transistors; and
   means for adjusting a current of said first current source to vary the phase of said phase shifter circuit.

8. The circuit of claim 6 further comprising a limiter coupled across said capacitor.

* * * * *